US007007253B2

(12) United States Patent
Gullapalli et al.

(10) Patent No.: US 7,007,253 B2
(45) Date of Patent: Feb. 28, 2006

(54) METHOD AND APPARATUS FOR DISTORTION ANALYSIS IN NONLINEAR CIRCUITS

(75) Inventors: Kiran K. Gullapalli, Austin, TX (US); Mark M. Gourary, Moscow (RU); Sergei G. Rusakov, Moscow (RU); Sergei L. Ulyanov, Moscow (RU); Mikhail M. Zharov, Moscow (RU)

(73) Assignee: Freescale Semiconductor, Inc., Austin, TX (US)

(*) Notice: Subject to any disclaimer, the term of this patent is extended or adjusted under 35 U.S.C. 154(b) by 196 days.

(21) Appl. No.: 10/657,304

(22) Filed: Sep. 8, 2003

(65) Prior Publication Data

US 2004/0083437 A1 Apr. 29, 2004

(30) Foreign Application Priority Data

Oct. 28, 2002 (RU) ............... PCT/RU02/00474

(51) Int. Cl.
*G06F 17/50* (2006.01)
(52) U.S. Cl. .................. 716/5; 716/4; 716/6
(58) Field of Classification Search ............ 716/4–6; 703/2, 14–16
See application file for complete search history.

(56) References Cited

U.S. PATENT DOCUMENTS

| 3,705,409 | A | * | 12/1972 | Brayton et al. | ............... 716/1 |
| 6,031,986 | A | | 2/2000 | Milsom | |
| 6,154,716 | A | * | 11/2000 | Lee | ............... 703/2 |
| 6,166,599 | A | * | 12/2000 | Aparin et al. | ............... 330/149 |
| 6,253,359 | B1 | | 6/2001 | Cano et al. | |
| 6,349,272 | B1 | * | 2/2002 | Phillips | ............... 703/2 |
| 6,530,065 | B1 | * | 3/2003 | McDonald et al. | ............... 716/4 |
| 6,536,026 | B1 | | 3/2003 | Gullapalli | |

OTHER PUBLICATIONS

Moradi et al. "An analytical method for noise analysis of a dual gate fet mixer", 2nd International Conference on Microwave Technology, 2000, IEEE, pp. 92-95.*
Sansen, Willy; "Distortion in Elementary Transistor Circuits"; IEEE Transactions of Circuits and Systems-II: Analog and Digital Signal Processing; Mar., 1999; pp 315-325; vol. 46, No. 3, IEEE.

(Continued)

*Primary Examiner*—Matthew Smith
*Assistant Examiner*—Naum Levin
(74) *Attorney, Agent, or Firm*—Joanna G. Chiu; James L. Clingan, Jr.

(57) ABSTRACT

A circuit on an integrated circuit is made from a design that is verified using a design tool. The design tool takes a model of the circuit and generates equations with respect to nodes on the circuit. The time consuming task of completely determining the voltage at each node is performed for a predetermined input. To determine the node voltages for other signals, the first order transfer function of the equations is taken and then calculated for the predetermined input. A first order estimate of the node voltages is achieved using this first order transfer function and the node voltages determined from the predetermined input. A second order estimate is achieved using the first order transfer function and the first order estimate. A third order estimate is achieved using the first order transfer function and the second order estimate. The circuit design is verified for manufacturabiltity then manufactured.

23 Claims, 1 Drawing Sheet

OTHER PUBLICATIONS

Feng, Dan et al.; "Efficient Computation of Quasi-periodic Circuit Operating Conditions Via a Mixed Frequency/Time Approach"; Proceeding of the 36$^{th}$ Design Automation Conference; Jun. 21-25, 1999; p 635-640; IEEE.

Chen, Jess et al.' "Simulation and Modeling of Intermodulation Distortion in Communication Circuits"; Proceedings of IEEE 1999 Custom Integrated Circuits Conference; May 16-19, 1999; pp 5-8; IEEE.

Narayanan, S.; "Transistor Distortion Analysis Using Volterra Series Representation"; Bell System Technical Journal; May-Jun., 1997; Bell Systems.

Maas, Stephen A.; "Nonlinear Microwave Circuits"; 1997, pp 155-207; ISBN 0-7803-3403-5; IEEE Press.

Chisholm, Stephen H. et al.; "Efficient Computer Simulation of Distortion in Electronic Circuits"; IEEE Transaction on Circuit Theory; Nov., 1973; pp742-745; IEEE.

* cited by examiner

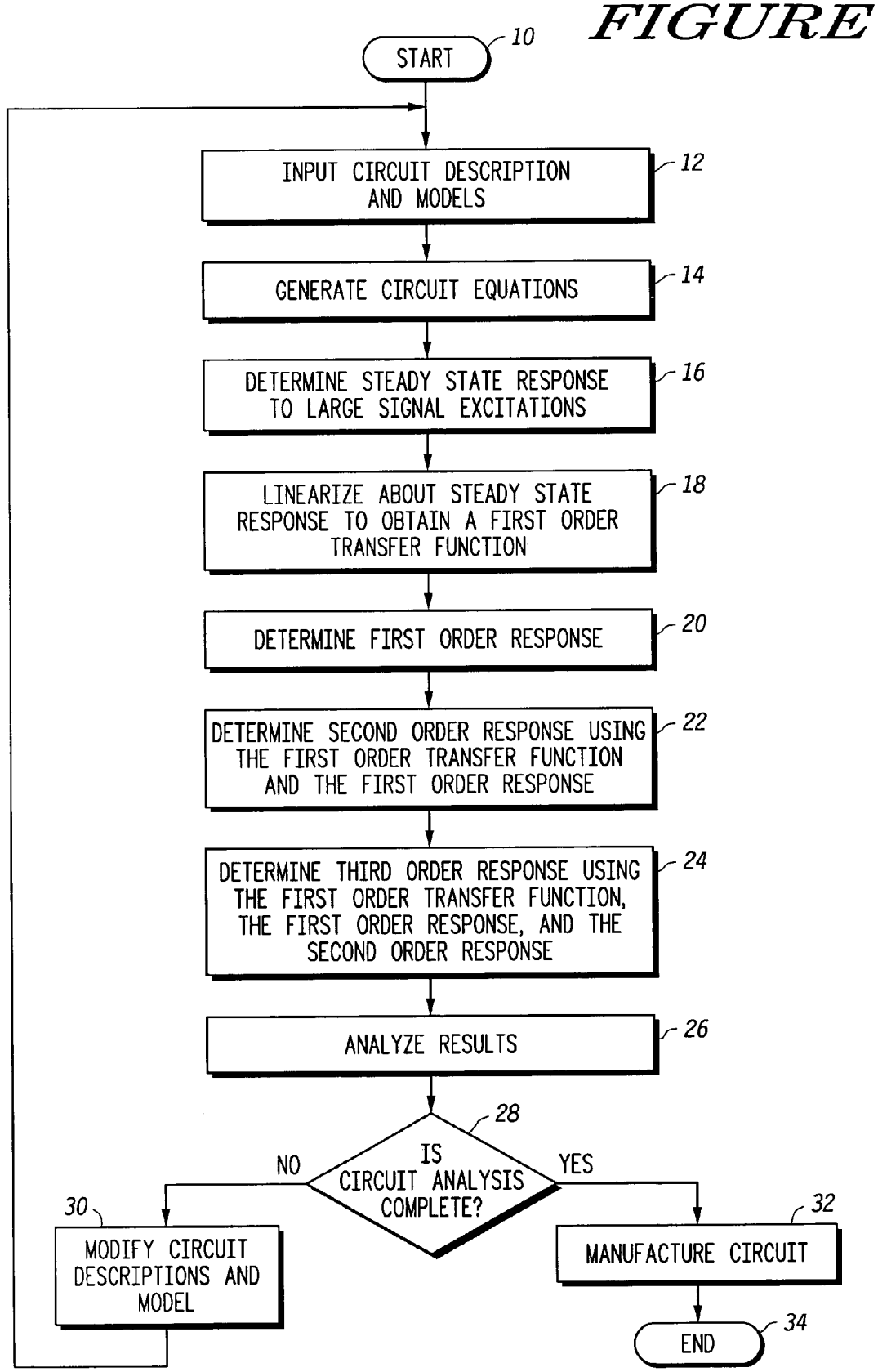

METHOD AND APPARATUS FOR DISTORTION ANALYSIS IN NONLINEAR CIRCUITS

RELATED APPLICATION

The current Application is related to U.S. Pat. No. 6,536,026, entitled "METHOD AND APPARATUS FOR ANALYZING SMALL SIGNAL RESPONSE AND NOISE IN NONLINEAR CIRCUITS," filed on Jun. 30, 2001, and assigned to the current assignee hereof.

FIELD OF THE INVENTION

The present inventions relates generally to circuit analysis, and more specifically, to analyzing distortion in nonlinear circuits.

RELATED ART

Nonlinear circuits are typically excited by multiple signals. Under the influence of these signals, circuit properties (e.g. currents, voltages, etc.) vary with time. For example, circuits, such as switched-capacitor filters and mixers, are excited with multi-tone signals, such as with a periodic clock and one or more input signals that are to be processed by the filter. The circuit responds nonlinearly to the clock. The input signals are generally small, not substantially perturbing the periodic steady-state response of the circuit to the periodic clock. Although the circuit responds nonlinearly to the large signal (i.e. periodic clock), the response to the input signals is generally almost linear. Furthermore, it is this small signal processing that is the main function of the circuit. The small signals generally contain, in addition to the linear response, distortion products that arise due to the inherent nonlinearities of the circuit. These distortion products, for example, may include harmonic distortion, intermodulation distortion, etc.

The analysis of strong nonlinear effects, such as gain compression, have to be handled with full nonlinear analysis. In the presence of weak nonlinearities, small input signals cause responses that are also small signals, except that they contain distortion products. Full nonlinear analysis to compute the distortion in the small signals is costly in computation and storage, and therefore, raises the cost and increases the time to market of new circuit designs. Therefore, a need exists for a method to analyze small signal distortion that reduces cost and time to market.

BRIEF DESCRIPTION OF THE DRAWINGS

The present invention is illustrated by way of example and not limitation in the accompanying figures, in which like references indicate similar elements, and in which:

FIG. 1 illustrates, in flow diagram form, a method for analyzing small signal distortion of a nonlinear circuit, according to one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Various embodiments of the present invention provide for distortion analysis to measure the second and third order deviation of a circuit response from a desired linear response using only first order transfer functions. Alternate embodiments measure higher order deviation of the circuit response in addition to the second and third orders. Furthermore, the determination of this higher order deviation may also be performed using only the first order transfer functions.

FIG. 1 illustrates, in flow diagram form, a method for analyzing small signal distortion of a nonlinear circuit according to one embodiment of the present invention. In block 12, a circuit description and corresponding circuit element models are provided. (Note that circuit can be any type of circuit, such as, for example, any type of analog circuit.) A circuit description represents the elements and their connectivity present in an electrical circuit. Each element within the circuit description has a corresponding circuit element model which describes the behavior of the element. These descriptions and models can be in a variety of different formats (e.g. SPICE format, etc.) and may be contained within one or more computer readable files. Also included within the circuit description are any periodic excitations of the circuit as well as any direct current (DC) inputs. The excitations may include any number of both large amplitude and small amplitude periodic excitations. Large periodic amplitude excitations refer to those that determine the steady-state response of the circuit and small amplitude periodic excitations (i.e. small signals) refer to those that do not substantially perturb the steady-state response of the circuit. Note that, as used herein, large signal excitations may include both large periodic amplitude excitations and DC voltages; therefore, in some circuit descriptions, no large periodic amplitude excitations may exist.

In block 14, circuit equations are generated based on the circuit description and models. These circuit equations embody the traditional circuit laws such as Kirchoff's voltage and current laws (KVL and KCL). The current contributions of the individual circuit elements at each node of the circuit can be determined by evaluating the circuit element models. The result is a system of nonlinear differential equations that may be represented by:

$$F(x)=b \qquad \text{Equation 1}$$

In the above equation, x is a vector that represents the solution of the circuit taking into consideration all input signals (including large and small signals) of the circuit. (Note that more specific examples of F(x) will be provided in the descriptions below.) Flow proceeds to block 16 where the steady state response to large signal excitations (excluding any small signal excitations) is computed by solving the system of equations (i.e. equation 1). Generally, at $F(x)=b_0$, the system of equations can be solved to determine $x_0$. Note that $b_0$ indicates that only the large signal excitations are included in this equation. In the case of a circuit having only DC excitations, the value $x_0$ represents the solution to the circuit, where the solution to the circuit includes the voltages at each node within the circuit plus any additional branch currents necessary to describe the state of the circuit. In the case of a circuit having large signal periodic excitations, the value $x_0$ represents the solution to the circuit (as described in the previous sentence) over one period of excitation. Note that if the circuit includes more than one large signal excitation, the period of excitation of the circuit takes into consideration the period of excitation due to each of the large signal excitations, as will be described below in reference to the examples below. The value $x_0$ can therefore be considered the steady state response to large signal excitations, excluding any small signal excitations.

Flow proceeds to block 18 where a first order transfer function is obtained by linearizing the circuit equations about the steady state response. In order to linearize about the steady state response, the first order transfer function at $x_0$ is computed, where the first order transfer function corresponds to the first derivative of $F(x)$. Therefore, the first order transfer function about $x_0$ can be expressed as $F'(x_0)$.

As discussed above, small signal excitations may introduce a small signal response that includes distortion. When taken into consideration, the small signal response is a deviation from $x_0$ (since the solution $x_0$ takes into consideration only the large signal excitations). Therefore, in one embodiment, the deviation from $x_0$ is determined through the use of the first, second and third order responses of the circuit, as will be described below. Alternatively, higher order responses may also be used.

Flow proceeds to block 20 where the first order response of the circuit (including both large and small signal excitations) is determined as shown below in equation 2.

$$F'(x_0)(x-x_0)=b-F(x_0) \qquad \text{Equation 2}$$

Equation 2 can be solved for x, where $x=x_1$ such that $F'(x_0)(x_1-x_0)=b-F(x_0)$. Note that $x_1$ is therefore the first order approximation or estimation of x in equation 1 above which takes into consideration both large and small signal excitations. Flow then proceeds to block 22 where the second order response of the circuit (including both large and small excitations) is determined using the first order transfer function and the first order response, as shown below in equation 3.

$$F'(x_0)(x-x_1)=b-F(x_1) \qquad \text{Equation 3}$$

Equation 3 can be solved for x, where $x=x_2$ such that $F'(x_0)(x_2-x_1)=b-F(x_1)$. When $b-b_0$ is small, it can be shown that $x_2$ is the second order approximation of x in equation 1 above. Note also that in equation 3, the first order transfer function at $x_0$ (which was already previously determined in block 18) is used to obtain $x_2$ rather than having to recalculate the first order transfer function at $x_1$ (i.e. $F'(x_1)$ need not be computed). This reduces the complexity and amount of computations required for determining an approximation for x in equation 1. That is, using the same first order transfer function at $x_0$, an approximation value, $x_2$, may be determined for x where $x_2$ is accurate to the second order.

Flow then proceeds to block 24 where the third order response to the circuit (including both large and small signal excitations) is determined using the first order transfer function and the second order response, as shown below in equation 4.

$$F'(x_0)(x-x_2)=b-F(x_2) \qquad \text{Equation 4}$$

Equation 4 can therefore be solved for x, where $x=x_3$ such that $F'(x_{)(x3}-x_2)=b-F(x_2)$. Note that $x_3$ is therefore the third order approximation of x in equation 1 above. Note also that in equation 4, the first order transfer function at $x_0$ (which was already previously determined in block 18) is used to obtain $x_3$ rather than having to recalculate the first order transfer function at $x_2$. As mentioned above, this reduces the complexity and amount of computations required for estimating x in equation 1. That is, using the same first order transfer function at $x_0$, an estimate, $x_3$, may be determined for x where $x_3$ is accurate to the third order. Alternate embodiments may continue in the same manner to determine estimates that are accurate to a higher order, while continuously using only the first order transfer function at $x_0$, thus reducing computation time and complexity.

Note that $x_0$ is determined taking into consideration a predetermined set of inputs including only the large signals (i.e. $x_0$ represents the steady state response to the large signals) while $x_3$ is determined taking into consideration another predetermined set of inputs including both large and small signals (i.e. $x_3$ represents the third order response to the circuit including both large and small signals). Therefore, $x_3$ may be used to estimate the distortion introduced by the small signals with a third order accuracy. Furthermore, determination of the deviation from $x_0$ with a third order accuracy can be done using only the first order transfer function at $x_0$ without the need of higher order transfer functions or the need to recalculate the transfer function at different points other than $x_0$.

After block 24, flow proceeds to block 26 where the results are analyzed. For example, the results may be post-processed to derive additional quantities that allow the circuit designer to determine if the circuit design meets required specifications. Also, the designer may determine which circuit component contributed to the distortion such that specific circuit components (such as individual transistors) can be targeted for redesign. Therefore, any type of analysis may be performed. The designer can then determine whether the circuit analysis is complete. If so, the design analysis is complete and the circuit (which may be an integrated circuit) can be manufactured (block 32); otherwise, the designer may modify the circuit description and models (in block 30) to improve the design or to overcome any shortcomings and repeat the analysis process at block 12. For example, the designer may change the circuit topology or modify transistor geometries or process parameters to achieve or surpass the required specifications.

As was described above, an iterative method can be applied to solve the nonlinear system of equations, $F(x)=b$. The iterative method can be described using the following iterative formula:

$$J(x_0)(x_{j+1}-x_j)=b-F(x_j) \ j=0,1,2,\ldots \qquad \text{Equation 5}$$

In equation 5, J is the Jacobian matrix representing the first order transfer function of the system of equations at $x_0$ (analogous to $F'(x_0)$ described above). That is, the first order transfer function of a system of equations can be represented as a Jacobian matrix. In equation 5, j is the number of the iteration. That is, for j=0 (corresponding to the first iteration), the first order response may be determined, as was described in reference to equation 2 above, where x was determined to be $x_1$, such that the resulting equation can be expressed as $J(x_0)(x_{1-x0})=b-F(x_0)$. Note that the approximation of x determined from equation 5 rapidly converges towards the actual solution of $F(x)=b$ assuming that small signals are sufficiently small.

One embodiment uses an alternate method to compute the iterative formula given by equation 5 such that rounding errors in the computation are reduced. This alternate method uses the following expression (equation 6) to express a next approximation, $x_{j+1}$.

$$x_{j+1}=x_j+\Delta x_j \qquad \text{Equation 6}$$

That is, the next approximation, $x_{j+1}$, is simply the previous approximation, $x_j$, with an added change in the previous approximation, $\Delta x_j$. Therefore, by substituting $x_{j+1}-x_j$ with $\Delta x_j$ in equation 5 above, equation 5 can be rewritten as follows.

$$\Delta x_j = J^{-1}(x_o)(b-F(x_j)) \qquad \text{Equation 7}$$

Note that in this method, a nonlinear problem is assumed to be presented in the form of operator equation $F(x)=b$. This method aims to reformulate the expressions to provide more accurate computations (e.g. by reducing rounding errors). Also, as will be seen below, this alternate method allows for the determination of the contributions of certain devices in the total distortion.

Equation 7 above can be represented by the following equation.

$$J\Delta x_j = r_j \qquad \text{Equation 8}$$

In the above equation, note that, as described above, $J=F'(x_0)$. Also, $r_j$ can be expressed as follows.

$$r_j = b - F(x_j) \qquad \text{Equation 9}$$

The following equation therefore represents the previous step (j−1) for equation 9.

$$b = r_{j-1} + F(x_{j-1}) \qquad \text{Equation 10}$$

After substituting equation 10 into equation 9, the following equation is obtained.

$$r_j = J\Delta x_{j-1} + F(x_{j-1}) - F(x_j) \qquad \text{Equation 11}$$

Note that $r_0 = b - b_0$, but without loss of generality, $b_0$ can be assumed to be 0 such that $r_0 = b$. Also, as described above, the use of this alternate method allows for the ability to determine the contribution of the nonlinear devices to the total output distortion. This can be done by representing the right hand side of equation 11 containing the terms $F(x)$ and $J$ as the sum of the corresponding devices' contributions, as follows.

$$\text{Equation 12:} \quad F(x) = \sum_{i=1}^{N} F_i(x)$$

$$\text{Equation 13:} \quad J = \sum_{i=0}^{N} J_i$$

In equations 12 and 13, i is the device index where N is the number of devices. Therefore, substituting into equation 11 above, the following equation is obtained.

$$\text{Equation 14:} \quad r_j = \sum_{i=1}^{N} (J_i \Delta x_{j-1} + F_i(x_{j-1}) - F_i(x_j)) = \sum_{i=1}^{N} r_{j,i}$$

The right hand side vector corresponding to the i-th device can be expressed as follows.

$$r_{j,i} = J_i \Delta x_{j-1} + F_i(x_{j-1}) - F_i(x_j) \qquad \text{Equation 15}$$

Then the update for the contribution of the i-th device ($\Delta x_{j,i}$) can be obtained by solving the following linear system.

$$J\Delta x_{j,i} = r_{j,i} \qquad \text{Equation 16}$$

Note that in order to reduce the requirements on memory, one embodiment may compute and store the distortion in some (but not all) nodes of the circuit. Alternatively, the distortion can be computed and stored for all nodes of the circuit.

The above description provided for FIG. 1 can be applied to determine distortion in various types of circuits and can be solved in a variety of different ways. For example, the method of FIG. 1 can be applied to a circuit having time-invariant large signals, or can be applied to a circuit having time varying large signals. In the latter case, the distortion can be computed in either the time domain or the frequency domain. Examples will be discussed below. In each of these cases, the system of equations, $F(x)=b$, for a circuit can be generally represented as follows (corresponding to block 14 of FIG. 1).

$$i(v_L + v_s) + \dot{q}(v_L + v_s) = u_L + u_s \qquad \text{Equation 17}$$

In the above equation, note that $u_L$ corresponds to the vector of large signal excitations and $u_s$ corresponds to the vector of small signal excitations. Also, $i(v_L + v_s)$ represents the resistive currents, and $\dot{q}(v_L + v_s)$ represents the capacitive currents. In each of the circuit types, first the steady state response, $v_L$, to the large signal excitations is determined (block 16 of FIG. 1) by solving $i(v_L) + \dot{q}(v_L) = u_L$. (Note that if $u_L$ is time-invariant, then the capacitive component can be ignored when solving $v_L$). Next, the response, $v_s$, to the small signal excitations is desired; however, computing $v_s$ can be complex and computationally expensive. Therefore, as discussed in reference to FIG. 1, $v_s$ can be approximated by $v_{s,3}$ which corresponds to the approximation of $v_3$ accurate to the third order. Therefore, the full response accurate to the third order, $v_3$ can be represented as follows.

$$v_L + v_{s,3} = v_3 \qquad \text{Equation 18}$$

Various embodiments use different methods to represent and obtain $v_3$ (corresponding to blocks 18–24 of FIG. 1), some examples of which will be provided below. Each of the examples below obtains $v_3$, the response accurate to the third order, using only the first order transfer function without needing to compute the second and third order transfer functions.

In a first example, a circuit having a DC operating point is analyzed, where the circuit has only DC current or voltage sources (i.e. time-invariant sources. Therefore, the circuit equations (corresponding to $F(x)=b$) generated in block 14 are time-invariant. In a circuit having only time-invariant sources, the total solution to the circuit equations, accurate to the third order can be approximated as the sum of a DC component (corresponding to $v_{3,0}$ in equation 19 below), a scaled sine wave with frequency $\omega_S$ (corresponding to $V_{3,1}e^{j\omega_s t} + V^*_{3,1}e^{-j\omega_s t}$ in equation 19 below), a scaled sine wave with frequency $2\omega_S$ (corresponding to $V_{3,2}e^{j2\omega_s t} + V^*_{3,2}e^{-j2\omega_s t}$ in equation 19 below), and a scaled sine wave with frequency $3\omega_S$ (corresponding to $V_{3,3}e^{j3\omega_s t} + V^*_{3,3}e^{-j3\omega_s t}$ in equation 19 below), as shown in equation 19.

$$v_3(t) = v_{3,0} + V_{3,1}e^{j\omega_s t} + V^*_{3,1}e^{-j\omega_s t} + V_{3,2}e^{j2\omega_s t} + V^*_{3,2}e^{-j2\omega_s t} + V_{3,3}e^{j3\omega_s t} + V^*_{3,3}e^{-j3\omega_s t} \qquad \text{Equation 19}$$

Note that in the above equation, $v_3(t)$ refers to the third order accurate response. The superscript "*" indicates the complex conjugate. The first subscript in $V_{k,j}$ refers to the order of the response and the second subscript refers to the harmonic of the small signal. Without loss of generality, a small signal excitation of the form $u_s(t) = u_1 e^{j\omega_s t} + u_1 e^{-j\omega_s t}$ is assumed. Here, $u_1$ is a small constant. In general $u_s(t)$ can have harmonic content. However, this is omitted from the discussion to simplify notation.

One goal of the current example is to obtain $v_3(t)$, which is the total response that is accurate to third order in the small signal strength $u_1$. Note that $v_3(t)$ will be obtained using only the first order transfer function along with the first and second order responses, as will be described below. That is, in the current example, the second and third order transfer functions are not required thus allowing for reduced computation complexity. Therefore, there is a need to solve for $v_{3,0}$, $V_{3,1}$, $V_{3,2}$ and $V_{3,3}$ in equation 19 above. These correspond to the Fourier coefficients of the total response and describe the response accurate to the third order. The process for solving for these coefficients begins by computing the DC solution (block 16 of FIG. 1) at the operating point using the circuit equations generated in block 14 of FIG. 1. For example, in a circuit having only DC current or voltage sources, the system of equations, F(x)=b, can be represented as follows:

$$i(v_L) = u_L \quad \text{Equation 20}$$

In the above equation, $i(v_L)$ is the vector of resistive currents and $u_L$ is the vector of large signals representing the DC excitation. $v_L$ is the DC response or the operating point of the circuit (corresponding to the steady state response). Using equation 20, $v_{0,0}$ (the DC operating point in response to $u_1$) can be computed. (Note that $v_{0,0}=v_L$.)

Next, in block 18 of FIG. 1, the circuit element models are linearized about the DC operating point. This yields the time-invariant conductances, g, and capacitances, c, for each circuit element model. This is needed to construct the linear time-invariant equations of block 18 used to obtain the first order transfer function. The equations for g and c are as follows:

$$\text{Equation 21:} \quad g = \frac{d\,i(v_L)}{d\,v_L}$$

$$\text{Equation 22:} \quad c = \frac{d\,q(v_L)}{d\,v_L}$$

The time-invariant conductances and capacitances are used to generate the time-invariant linear system of differential equations that embody Kirchoff's current laws for the small signal response. This produces a representation of the circuit's response to the small excitations (see equation 23 below). Therefore, the nonlinear system of equations computed in block 14 is approximated with a linear system of equations with time-invariant coefficients.

$$\text{Equation 23:} \quad \frac{c \cdot d[v_{S,1}(t)]}{dt} + g \cdot v_{S,1}(t) - u_S(t) = 0$$

In the above equation, $v_{s,1}(t)$ is the response to $u_s(t)$ accurate to the first order where $u_s(t)$ refers to a small amplitude excitation. Thus the system is linear and time-invariant. This provides the first order transfer function as "$j\omega_s c+g$" such that $(j\omega_s c+g)v_{s,1}=u_s$. The first order transfer function is then used to determine the first order response (block 20 of FIG. 1), where the first order response can be represented as follows.

$$v_1(t) = v_{1,0} + V_{1,1}e^{j\omega_s t} + V^*_{1,1}e^{-j\omega_s t} \quad \text{Equation 24}$$

Equation 24 above represents the response to the small signal excitation that is accurate to the first order. Since $V_{1,1}$ does not change the DC operating point, we already have $v_{1,0}=v_{0,0}$. To obtain $V_{1,1}$ we solve the following equation.

$$(j\omega_s C+G)V_{1,1} = u_1 \quad \text{Equation 25}$$

In equation 25, G and C are matrices constructed from the conductances and capacitances (g and c) of the individual elements of the circuit. Note that equation 25 above represents the first order transfer function, $(j\omega_s C+G)$, and is used to obtain $v_1(t)$. Having obtained $v_1(t)$, the process proceeds to block 22 where the second order response is determined using the first order transfer function and the first order response. Equation 26 below provides the second order response that is accurate second order.

$$v_2(t) = v_{2,0} + V_{2,1}e^{j\omega_s t} + V^*_{2,1}e^{-j\omega_s t} + V_{2,2}e^{j2\omega_s t} + V^*_{2,2}e^{-j2\omega_s t} \quad \text{Equation 26}$$

Note that the response to the small signal is being solved in the frequency domain in the current embodiment. Therefore, the circuit function is evaluated in the frequency domain as follows: $F(V)=\Gamma i(v)+\Omega\Gamma q(v)$. That is, F(V) represents the KCL equations of the circuit in the frequency domain. Here $\Gamma$ is the DFT matrix, and $\Omega$ is a diagonal matrix $D(0,j\omega_s,2j\omega_s,-2j\omega_s,-\omega_s)$. The terms i(v) and q(v) are evaluated using $v=v_1(t)$ at 5 uniformly spaced time-points over $2\pi/\omega_s$. The time-domain voltage v is obtained from the Fourier coefficients V using the inverse DFT matrix. Thus, F contains the DC component $F_{2,0}$, the fundamental component $F_{2,1}$ and the second harmonic component $F_{2,2}$. These are then used to compute the second order response as follows:

$$Gv_{2,0} = F_{2,0} \quad \text{Equation 27}$$

$$(j\omega_s C+G)V_{2,1} = u_1 + F_{2,1} \quad \text{Equation 28}$$

$$(j2\omega_s C+G)V_{2,2} = F_{2,2} \quad \text{Equation 29}$$

Note that $u_1$ only enters into equation 28 because it is assumed to be the Fourier coefficient of the excitation only at the frequency $\omega_s$. Equation 27 gives $v_{2,0}$, the DC content of the second order response. Equation 28 gives $V_{2,1}$, the fundamental content of the second order response. Equation 29 gives $V_{2,2}$, the second harmonic content of the second order response. Note that in each of equations 27, 28, and 29, only the first order transfer function, $(j\omega_s C+G)$, is used, evaluated at different frequencies (0, $\omega_s$ and $2\omega_s$ respectively).

The total second order response of equation 26 is then used to compute the third order response that is accurate to the third order (block 24 of FIG. 1). The third order response is as given above in equation 19. The circuit function in the frequency domain is evaluated as follows: $F(V)=\Gamma i(v)+\Omega\Gamma q(v)$. Here $\Gamma$ is the DFT matrix, and $\Omega$ is a diagonal matrix $D(0,j\omega_s,2j\omega_s, 3j\omega_s,-3j\omega_s,-2\omega_s,-\omega_s)$. The terms i(v) and q(v) are evaluated using $v=v_2(t)$ at 7 uniformly spaced time-points over $2\pi/\omega_s$. Therefore, F contains the DC component $F_{3,0}$, the fundamental component $F_{3,1}$, the second harmonic component $F_{3,2}$, and the third harmonic component $F_{3,3}$. These are then used to compute the third order response using the following equations:

$$Gv_{3,0} = F_{3,0} \quad \text{Equation 30}$$

$$(j\omega_s C+G)V_{3,1} = u_1 + F_{3,1} \quad \text{Equation 31}$$

$$(j2\omega_s C+G)V_{3,2} = F_{3,2} \quad \text{Equation 32}$$

$$(j3\omega_s C+G)V_{3,3} = F_{3,3} \quad \text{Equation 33}$$

Equation 30 gives $v_{3,0}$, the DC component of the third order response. Equation 31 gives $V_{3,1}$, the fundamental content of the third order response. Equation 32 gives $V_{3,2}$, the second harmonic content of the third order response. Equation 33 gives $V_{3,3}$, the third harmonic content of the third order response. Note that again, only the first order transfer function, $(j\omega_s C+G)$, is used, evaluated at different frequencies (0, $\omega_s$, $2\omega_s$, and $3\omega_s$, respectively).

This completes the determination of the small signal response to third order accuracy as represented by equation 19. Furthermore, only the first order transfer function was needed where the first order transfer function was evaluated at different frequencies. Flow can then proceed with block 26, as was described above. Note that the above procedure gives the response to third order accuracy only if the input signal is small. Therefore, in one embodiment, the input signal is considered small if, when its magnitude is increased by a factor of 2, $V_{3,2}$ increases by a factor of at most approximately 4 and $V_{3,3}$ increases by a factor of at most approximately 8. That is, if this relationship is true (to a good approximation), then the input signal has satisfied the assumption of being small. If, upon increasing the small signal amplitude by a factor of 2, the corresponding increase in $V_{3,2}$ and $V_{3,3}$ deviate significantly from a factor of 4 and 8 respectively, then a complete nonlinear analysis should be used since the small signal assumption is violated.

Note that in a multi-tone system (i.e. a circuit receiving more than one tone), equation 19 above can be represented, in the case of a 2-tone excitation, as follows:

$$\text{Equation 34:} \quad v_3(t) = \sum_{n=-3}^{3} \sum_{m=-3}^{3} V_{n,m} e^{jn\omega_{s1}t} e^{jm\omega_{s2}t}$$

This equation describes the response to a two-tone small signal input where the two input frequencies are $\omega_{s1}$ and $\omega_{s2}$. Therefore, the same procedures described above can be applied to a multi-tone system.

In a second example, a circuit having a periodic time-domain steady state response is analyzed. That is, in the current example, the large signals include time-varying periodic input signals. The total solution, $v_s(t)$, is represented in mixed frequency-time domain (MFT) consisting of a summation of terms such as $V_n(t)e^{jn\omega_s t}$ (see equation 35 below). That is, $V_n(t)$ is the time-varying complex amplitude (i.e. amplitude modulation) of the sine wave represented by $e^{jn\omega_s t}$. In response to this small signal input, the response to the third order is desired in the following form:

$$v_3(t) = v_{3,0}(t) + V_{3,1}(t)e^{j\omega_s t} + V^*_{3,1}(t)e^{-j\omega_s t} + V_{3,2}(t)$$
$$e^{j2\omega_s t} + V^*_{3,2}(t)e^{-j2\omega_s t} + V_{3,3}(t)e^{j3\omega_s t} + V^*_{3,3}(t)e^{-j3\omega_s t} \quad \text{Equation 35}$$

Without loss of generality, a small signal excitation of the form $u_s(t)=u_1 e^{j\omega_s t}+u_1 e^{-j\omega_s t}$ is assumed. Here, $u_1$ is a small constant. In general $u_s(t)$ can have harmonic content. However, this is omitted from the discussion to simplify notation.

One goal of the current embodiment is to obtain $v_3(t)$, which is the total response that is accurate to third order in the small signal strength $u_1$. Note that as in the first example, $v_3(t)$ will be obtained using only the first order transfer function along with the first and second order responses, as will be described below. That is, in the current example, the second and third order transfer functions are not required thus allowing for reduced computation complexity. Therefore, there is a need to solve for $v_{3,0}(t)$, $V_{3,1}(t)$, $V_{3,2}(t)$ and $V_{3,3}(t)$ in equation 35 above. These correspond to the periodically time-varying Fourier coefficients of the small signal response and describe the response accurate to third order. The process for solving for these coefficients begins by computing the periodic steady state, $v_{0,0}(t)$, in response to $u_L$ (block 16 of FIG. 1).

The steady-state response is computed in the time-domain in response to the large periodic excitations, such as, for example, a clock. The steady-state response generally refers to the state of the circuit after all transient effects have died off. This response is computed by solving the resulting system of nonlinear differential equations generated in block 14 of FIG. 1 as constrained by the periodic boundary conditions due to the periodic excitation. Furthermore, the differential equations are solved on a discrete time grid having a finite number of time sample points. Any standard method may be used to solve this system of nonlinear equations, such as, for example, the shooting-Newton method. Note that for this computation, the small amplitude excitations are ignored.

For example, the following equations represent the KCL for the circuit (equation 36) and the corresponding boundary conditions (equation 37):

$$\dot{q}(v_L(t)) + i(v_L(t)) - u_L = 0 \qquad \text{Equation 36}$$

$$v_L(T_L) = v_L(0) \qquad \text{Equation 37}$$

In the above equations, $u_L(t)$ refers to the large amplitude periodic excitation having a period of $T_L=2\pi/\omega_L$ (such as a clock that is a square wave). Also, $i(v_L(t))$ is the vector of resistive currents and $\dot{q}(v_L(t))$ is the vector of capacitive currents. Note that in a multi-tone system, $u_L(t)$ may include large amplitude periodic excitations having different frequencies and periods, such as $T_{L1}=2\pi/\omega_{L1}$, $T_{L2}=2\pi/\omega_{L2}$, etc.

Next, in block 18 of FIG. 1, the circuit element models are linearized about the steady state response over one period of the excitation, assuming a single tone system. This yields the time-varying conductances, g(t), and capacitances, c(t), for each circuit element model. This is needed to construct the linear time-varying equations used to obtain the first order transfer function (which will be discussed below). The equations for g(t) and c(t) are as follows:

$$\text{Equation 38:} \quad g(t) = \frac{d\,i(v_L(t))}{d\,v_L}$$

$$\text{Equation 39:} \quad c(t) = \frac{d\,q(v_L(t))}{d\,v_L}$$

The time-varying conductances and capacitances are used to generate the time-varying linear system of differential equations that embody Kirchoff's current laws for the small signal response. This produces a representation of the circuit's response to the small excitations (see equation 40 below). Therefore, the nonlinear system of equations computed in block 14 of FIG. 1 is approximated with a linear system of equations with time-varying coefficients.

$$\text{Equation 40:} \quad \frac{d[c(t)v_{s,1}(t)]}{dt} + g(t)v_{s,1}(t) = u_S(t)$$

In the above equation, $v_{s,1}(t)$ is the response to $u_s(t)$ accurate to the first order where $u_s(t)$ refers to a small amplitude excitation. Note also that c(t) and g(t) are $T_L$ periodic, such that $g(t)=g(t+T_L)$ and $c(t)=c(t+T_L)$. Thus the system is linear and periodically time-varying with period $T_L$. This system with period $T_L=2\pi/\omega_L$ responds to a sinusoidal input of frequency $\omega_s$ (i.e. the frequency of the small amplitude excitation, $u_s(t)$) with a spectrum of components at:

$$\omega = \omega_s + l\omega_L \text{ where } l=0,\pm 1,\pm 2,\ldots \qquad \text{Equation 41}$$

This means that:

$$\text{Equation 42:} \quad v_S(t) = \sum_l V_l e^{j(\omega_s+l\omega_L)t} = V_1(t)e^{j\omega_s t}$$

$V_n$ is the envelope of the n-th harmonic component of the small signal response. It is a time-varying function with the same period as the large signal excitation. Note that this equation only describes the linear response to the small signal. However, the real system also responds with nonlinear terms, and the full solution has the form:

$$\omega = n\omega_S + l\omega_L \text{ where } l=0,\pm1,\pm2,\ldots \text{ and } n=0,\pm1,\pm2,\ldots \quad \text{Equation 43}$$

This means that:

$$\text{Equation 44: } v_S(t) = \sum_l \sum_n V_l e^{j(n\omega_S + l\omega_L)t} = \sum_n V_n(t) e^{jn\omega_S t}$$

In equation 44, it can be seen that all harmonics of the small signal frequency are also present in the solution. One goal of the current embodiment is to use only the linear response equation to construct the nonlinear response to the desired accuracy.

Note that equations 42 and 44 assume a single small signal tone system; however, the circuit can have a multi-tone small signal input. For example, equation 45 below corresponds to a two-tone response reflecting the sum of i harmonics of the first term and k harmonics of the second term, where, in one embodiment, i=k=3.

$$\text{Equation 45: } v(t) = \sum_{n=-i}^{i} \sum_{m=-k}^{k} V_{n,m}(t) e^{jn\omega_{s1}t} e^{jm\omega_{s2}t}$$

Referring back to FIG. 1, the first order transfer function is determined in block 18, and the first order response is determined in block 20. The response that is accurate to the first order is represented as follows.

$$v_1(t) = v_{1,0} + V_{1,1} e^{j\omega_s t} + V^*_{1,1} e^{-j\omega_s t} \quad \text{Equation 46}$$

Since $V_{1,1}$ does not change the steady state, $v_{1,0} = v_{0,0}$. To obtain $V_{1,1}$, the process proceeds as follows.

By substituting $V_1(t)e^{j\omega_s t}$ from equation 42 for $v_s(t)$ in equation 40 above, the following equation is obtained:

Equation 47:

$$\frac{d[c(t)V_1(t)e^{j\omega_s t}]}{dt} + g(t)V_1(t)e^{j\omega_s t} = u e^{j\omega_s t}$$

The time-varying linear system of differential equations is discretized by discretizing only the amplitude modulation, $V_1(t)$, and using an analytic derivative of the sine wave, $e^{j\omega_s t}$, as follows:

Equation 48:

$$\frac{d[c(t)V_1(t)]}{dt} + j\omega_s c(t)V_1(t) + g(t)V_1(t) = u$$

Flow then proceeds to block 20 of FIG. 1 where the first order response is be determined by solving for $V_1(t)$.

Equation 49:

$$\begin{bmatrix} G_1 + j\omega_S C_1 + \frac{C_1}{h_1} & 0 & 0 & -\frac{C_M}{h_1} \\ -\frac{C_1}{h_2} & G_2 + j\omega_S C_2 + \frac{C_2}{h_2} & 0 & 0 \\ 0 & 0 & \ddots & \vdots \\ 0 & 0 & -\frac{C_{M-1}}{h_m} & G_M + j\omega_S C_M + \frac{C_M}{h_M} \end{bmatrix}$$

$$\begin{bmatrix} V_1(1) \\ V_1(2) \\ \vdots \\ V_1(M) \end{bmatrix} = -\begin{bmatrix} u_1 \\ u_1 \\ \vdots \\ u_1 \end{bmatrix}$$

Note that $V_1(t)$ is computed at M uniformly spaced time-points index by the time-point number (1,2,...,M). G and C are matrices composed of the g(t) and c(t) of each circuit element. Here the subscripts on G, C, and h refer to the index of the time sample, and h is the time-step between time samples. Note that the left-most matrix in equation 49 is referred to as J (i.e. the first order transfer function) in the following description. Therefore, equation 49 can be re-written as follows:

$$J(\omega_s)V_{1,1} = u_1 \quad \text{Equation 50}$$

Equation 50 above represents the first order transfer function. After obtaining $v_1(t)$, the process proceeds to block 22 of FIG. 1 where the second order response is determined using the first order transfer function and the first order response. Equation 51 below provides the second order response that is accurate to the second order.

$$v_2(t) = v_{2,0}(t) + V_{2,1}(t)e^{j\omega_s t} + V^*_{2,1}(t)e^{-j\omega_s t} + V_{2,2}(t)$$
$$e^{j2\omega_s t} + V^*_{2,2}(t)e^{-j2\omega_s t} \quad \text{Equation 51}$$

Note that the response to the small signal in the frequency domain is being solved. Therefore, the circuit function is evaluated in the frequency domain as follows: $F_K(V) = \Gamma i_K(v) + \Omega \Gamma q_K(v)$, at each of the M time-points over the period $T_L$ (k=1,2, ... ,M). That is, $F_K(V)$ represents the KCL equations of the circuit in the frequency domain. Here $\Gamma$ is the DFT matrix, and $\Omega$ is a diagonal matrix $D(0, j\omega_S, 2j\omega_S, -2j\omega_S, -j\omega_S)$. The terms $i_K(v)$ and $q_K(v)$ are evaluated using $v = v_1(t)$ at 5 uniformly spaced time-points over $2\pi/\omega_S$. The time-domain voltage v at each time-point is obtained from the Fourier coefficients V at the corresponding time-point using the inverse DFT matrix. So, F contains the periodically time-varying DC component $F_{2,0}$, the fundamental component $F_{2,1}$ and the second harmonic component $F_{2,2}$. These are then used to compute the second order response as follows:

$$J(0)v_{2,0} = F_{2,0} \quad \text{Equation 52}$$

$$J(\omega_s)V_{2,1} = u_1 + F_{2,1} \quad \text{Equation 53}$$

$$J(2\omega_s)V_{2,2} = F_{2,2} \quad \text{Equation 54}$$

Note that $u_1$ enters only equation 53 because it is assumed to be the Fourier coefficient of the excitation only at the frequency $\omega_S$. Equation 52 gives $v_{2,0}$, the DC content of the second order response. Equation 53 gives $V_{2,1}$, the fundamental content of the second order response. Equation 54 gives $V_{2,2}$, the second harmonic content of the second order response. Note that in each of equations 52, 53, and 54, only the first order transfer function, J, is used, evaluated at different frequencies (0, $\omega_s$, and $2\omega_s$, respectively).

The total second order response is then used to compute the third order response that is accurate to the third order. The third order response is given above in equation 35. The circuit function in the frequency domain is evaluated as follows: $F_K(V)=\Gamma i_K(v)+\Omega\Gamma q_K(v)$ for k=1,2, ... M. Here $\Gamma$ is the DFT matrix, and $\Omega$ is a diagonal matrix $D(0,j\omega_s,2j\omega_s,3j\omega_s,-3j\omega_s,-2j\omega_s,-\omega_s)$. The terms i(v) and q(v) are evaluated using $v=v_2(t)$ at 7 uniformly spaced time-points over $2\pi/\omega_s$. Therefore, F contains the periodically time-varying envelopes of the DC component $F_{3,0}$, the fundamental component $F_{3,1}$, the second harmonic component $F_{3,2}$, and the third harmonic component $F_{3,3}$. These are then used to compute the third order response as follows:

$$J(0)v_{3,0}=F_{3,0} \quad \text{Equation 55}$$

$$J(\omega_s)V_{3,1}=u_1+F_{3,1} \quad \text{Equation 56}$$

$$J(2\omega_s)V_{3,2}=F_{3,2} \quad \text{Equation 57}$$

$$J(3\omega_s)V_{3,3}=F_{3,3} \quad \text{Equation 58}$$

Equation 55 gives $v_{3,0}$, the DC component of the third order response. Equation 56 gives $V_{3,1}$, the fundamental content of the third order response. Equation 57 gives $V_{3,2}$, the second harmonic content of the third order response. Equation 58 gives $V_{3,3}$, the third harmonic content of the third order response. Note that in each of equations 55, 56, 57, and 58, only the first order transfer function, J, is used, evaluated at different frequencies (0, $\omega_s$, $2\omega_s$, and $3\omega_s$, respectively).

This completes the determination of the small signal response to third order accuracy as represented by equation 35 according to the second example. Furthermore, only the first order transfer function was needed where the first order transfer function was evaluated at different frequencies. Flow can then proceed with block 26, as was described above.

In a third example, a circuit having a frequency domain steady state response is analyzed. That is, in the current example, the large signals include periodic large input signals. In response to the small signal input, the response to the third order in the following form is desired.

$$v_3(t)=v_{3,0}(t)+V_{3,1}(t)e^{j\omega_s t}+V^*_{3,1}(t)e^{-j\omega_s t}+V_{3,2}(t)e^{j2\omega_s t}+V^*_{3,2}(t)e^{-j2\omega_s t}+V_{3,3}(t)e^{j3\omega_s t}+V^{*3,3}(t)e^{-j3\omega_s t} \quad \text{Equation 59}$$

Without loss of generality, a small signal excitation of the form $u_s(t)=u_1 e^{-j\omega_s t}+u_1 e^{-j\omega_s t}$ is assumed. Here, $u_1$ is a small constant. In general $u_s(t)$ can have harmonic content. However, this is omitted from the discussion to simplify notation.

One goal of the current embodiment is to obtain $v_3(t)$, which the total response that is accurate to the third order in the small signal strength $u_1$. Note that is in the first two examples, $v_3(t)$ will be obtained using only the first order transfer function along with the first and second order responses, as will be described below. That is, in the current example, the second and third order transfer functions are not required thus allowing for reduced computation complexity. Therefore, there is a need to solve for $v_{3,0}(t)$, $V_{3,1}(t)$, $V_{3,2}(t)$ and $V_{3,3}(t)$. These correspond to the periodically time-varying Fourier coefficients of the small signal response and describe the response accurate to third order. The process for solving for these coefficients begins by computing the periodic steady state, $v_{0,0}(t)$, in response to $u_L$ (block 16 of FIG. 1).

The steady state response is computed in the frequency domain in response to the large periodic excitations. This response is computed by solving the resulting system of nonlinear differential equations generated in block 14 of FIG. 1 as constrained by the periodic boundary conditions due to the periodic excitation. Furthermore, the differential equations in the time domain are converted to algebraic equations in the frequency domain that are solved on a discrete frequency grid having a finite number of frequency sample points. Any standard method may be used to solve this system of nonlinear equations, such as, for example, the harmonic balance method. Note that for this computation, the small amplitude excitations are ignored.

For example, the following equation represents the KCL for the circuit (equation 60):

$$\Omega Q(V_L)+I(V_L)=U_L \quad \text{Equation 60}$$

In the above equation, $U_L$ refers to Fourier components of the large amplitude periodic excitations having periods of $T_{L1}=2\pi/\omega_{L1}$, $T_{L2}=2\pi/\omega_{L2}$, etc. for each tone within a multi-tone system. Also, $I(V_L)$ is the Fourier transform of the vector of resistive currents, $Q(V_L)$ is the Fourier transform of the vector of capacitive currents, and $\Omega$ is the representation of the time derivative in the frequency domain.

Next, in block 18 of FIG. 1, the circuit element models are linearized about the steady state response. This yields the time-varying conductances, g, and capacitances, c, for each circuit element model. This is needed to construct the linear time-varying equations. First the steady state solution obtained in the frequency domain is converted into the time domain. Then, at each time-domain sample, the equations for g and c are as defined earlier in the time-domain:

Equation 61:

$$g(t)=\frac{di(v_L(t))}{dv_L}$$

Equation 62:

$$c(t)=\frac{dq(v_L(t))}{dv_L}$$

These periodically time-varying conductances and capacitances are converted into frequency domain conductance and capacitance matrices as follows:

$$G_F=\Gamma G_T \Gamma^{-1} \quad \text{Equation 63}$$

$$C_F=\Gamma C_T \Gamma^{-1} \quad \text{Equation 64}$$

In equations 63 and 64, $\Gamma$ is the matrix corresponding to the Fourier transform. The matrices $G_T$ and $C_T$ are the conductance and capacitance matrices for the entire circuit in the time-domain. The corresponding frequency domain matrices $G_F$ and $C_F$ are used to generate the systems of equations in the frequency domain that embody Kirchoff's current laws for the small signal response. This produces a representation of the circuit's response to the small excitations. Therefore, the nonlinear system of equations is approximated with a linear system of equations:

$$(G_F+(\Omega+j\omega_s)C_F)V_S=U_S \quad \text{Equation 65}$$

In the above equation, $V_s$ is the response to $U_s$ where $U_s$ refers to the frequency domain representation of the small amplitude excitation. As in the discussion of the time-domain solution, the nonlinear system with period $T_L=2\pi/\omega_L$ responds to a sinusoidal input of frequency $\omega_s$ (i.e. the frequency of the small amplitude excitation, $U_s$) with a spectrum of components at:

$$\omega = n\omega_s + l\omega_L \text{ where } l=0,\pm 1,\pm 2,\ldots \text{ and } n=0,\pm 1,\pm 2,\ldots \quad \text{Equation 66}$$

This means that:

Equation 67:

$$v_S(t) = \sum_l \sum_n V_{l,n} e^{j(n\omega_S + l\omega_L)t}$$

Note that one goal of the current embodiment is to obtain the coefficients in equation 67 using only the linear response equation given in equation 65.

Equation 67 assumes a single small signal tone system; however, the circuit can have a multi-tone small signal input. For example, equation 68 below corresponds to a two-tone response reflecting the sum of i harmonics of the first term and k harmonics of the second term, where, in one embodiment, i=k=3.

Equation 68:

$$v(t) = \sum_{n=i}^{i} \sum_{m=-k}^{k} V_{n,m}(t) e^{jn\omega_{s1}t} e^{jm\omega_{s2}t}$$

Referring back to FIG. 1, the first order transfer function is determined in block 18, and the first order response is determined in block 20. The response that is accurate to the first order is represented as follows.

$$v_1(t) = v_{1,0} + V_{1,1} e^{j\omega_s t} + V^*_{1,1} e^{-j\omega_s t} \quad \text{Equation 69}$$

Since $V_{1,1}$ does not change the steady state, $v_{1,0} = v_{0,0}$. To obtain $V_{1,1}$, the process proceeds as follows.

Note that equation 65 above represents the first order transfer function, $J_F$. Flow then proceeds to block 20 of FIG. 1 where the first order response is determined by solving the following equation.

$$J_F(\omega_s) V_{1,1} = U_1 \quad \text{Equation 70}$$

In equation 70, $J_F(\omega_s) = G_F + (\Omega + j\omega_s) C_F$ and is the matrix corresponding to the first order transfer function. Having obtained $v_1(t)$, the process proceeds to block 22 of FIG. 1 where the second order response is determined using the first order transfer function and the first order response. Equation 71 below provides the second order transfer function that is accurate to the second order.

$$v_2(t) = v_{2,0}(t) + V_{2,1}(t) e^{j\omega_s t} + V^*_{2,1}(t) e^{-j\omega_s t} + V_{2,2}(t) e^{j2\omega_s t} + V^*_{2,2}(t) e^{-j2\omega_s t} \quad \text{Equation 71}$$

Note that the response to the small signal in the frequency domain is being solved. So, the circuit function is evaluated in the frequency domain as follows: $F_K(V) = \Gamma i_K(v) + \Omega \Gamma q_K(v)$, at each of the M time-points over the period $T_L$ (k=1,2, ..., M). Here $\Gamma$ is the DFT matrix, and $\Omega$ is a diagonal matrix $D(0, j\omega_S, 2j\omega_S, -2j\omega_S, -\omega_S)$. The terms $i_K(V)$ and $q_K(v)$ are evaluated using $v = v_1(t)$ at 5 uniformly spaced time-points over $2\pi/\omega_S$. The time-domain voltage v at each time-point is obtained from the Fourier coefficients V at the corresponding time-point using the inverse DFT matrix. Therefore, F contains the periodically time-varying DC component $F_{2,0}$, the fundamental component $F_{2,1}$ and the second harmonic component $F_{2,2}$. These are then used to compute the second order response as follows:

$$J_F(0) v_{2,0} = F_{2,0} \quad \text{Equation 72}$$

$$J_F(\omega_s) V_{2,1} = U_1 + F_{2,1} \quad \text{Equation 73}$$

$$J_F(2\omega_s) V_{2,2} = F_{2,2} \quad \text{Equation 74}$$

Note that $U_1$ enters only equation 73 because it is assumed to be the Fourier coefficient of the excitation only at the frequency $\omega_S$. Equation 72 gives $v_{2,0}$, the DC content of the second order response. Equation 73 gives $V_{2,1}$, the fundamental content of the second order response. Equation 74 gives $V_{2,2}$, the second harmonic content of the second order response. Note that in each of equations 72, 73, and 74, only the first order transfer function, $J_F$, is used, evaluated at different frequencies (0, $\omega_S$, and $2\omega_S$, respectively).

The total second order response is then used to compute the third order response that is accurate to the third order. The third order response is given above in equation 59. The circuit function in the frequency domain is evaluated as follows: $F_K(V) = \Gamma i_K(v) + \Omega \Gamma q_K(v)$ for k=1,2, ..., M. Here $\Gamma$ is the DFT matrix, and $\Omega$ is a diagonal matrix $D(0, j\omega_S, 2j\omega_S, 3j\omega_S, -3j\omega_S, -2j\omega_S, -\omega_S)$. The terms i(v) and q(v) are evaluated using $v = v_2(t)$ at 7 uniformly spaced time-points over $2\pi/\omega_S$. So, F contains the periodically time-varying envelopes of the DC component $F_{3,0}$, the fundamental component $F_{3,1}$, the second harmonic component $F_{3,2}$, and the third harmonic component $F_{3,3}$. These are then used to compute the third order response as follows:

$$J_F(0) v_{3,0} = F_{3,0} \quad \text{Equation 75}$$

$$J_F(\omega_s) V_{3,1} = U_1 + F_{3,1} \quad \text{Equation 76}$$

$$J_F(2\omega_s) V_{3,2} = F_{3,2} \quad \text{Equation 77}$$

$$J_F(3\omega_s) V_{3,3} = F_{3,3} \quad \text{Equation 78}$$

Equation 75 gives $v_{3,0}$, the DC component of the third order response. Equation 76 gives $V_{3,1}$, the fundamental content of the third order response. Equation 77 gives $V_{3,2}$, the second harmonic content of the third order response. Equation 78 gives $V_{3,3}$, the third harmonic content of the third order response. Note that in each of equations 75, 76, 77, and 78, only the first order transfer function, $J_F$, is used, evaluated at different frequencies (0, $\omega_S$, $2\omega_S$, and $3\omega_S$, respectively).

This completes the determination of the small signal response to third order accuracy as represented by equation 59 according to the third example. Note that the frequency domain embodiment differs from the time-domain embodiment only in how the Jacobian J is defined (equation 70 in the third example vs equations 49 and 50 in the second example). Furthermore, as with the second example, only the first order transfer function was needed where the first order transfer function was evaluated at different frequencies. Flow can then proceed with block 26 of FIG. 1, as was described above.

Therefore, as can be appreciated, the embodiments described herein in reference to FIG. 1 provide for distortion analysis to measure the second and third order deviation of a circuit response from a desired linear response using only first order transfer functions. Note that distortion analysis using techniques known in the art today rely on the availability of all higher order derivatives (up to the third order) of all the multi-variable functions used to describe the behavior of semiconductor devices or elements used in modern integrated circuits. If higher order distortion, i.e. beyond the third order, is required, then other higher order derivatives are also necessary. This represents a very large overhead to model evaluation, greatly increasing the calculation cost, and, in many cases, can take several man months to implement. Furthermore, new models to describe semiconductor devices are developed each year, and these derivatives need to be implemented for every new model which, as described above, increases overhead tremendously. As can be understood from the descriptions herein in reference to FIG. 1, embodiments of the present invention may be used without requiring modifications to the device models. That is, the embodiments described herein may rely only on the first order derivatives for all functions that describe the behavior of semiconductor devices. These first order derivatives are generally readily available and commonly used in a variety of other analyses. Therefore, embodiments of the present invention may support the analysis of distortion in integrated circuits with minimal effort, even in those using newly developed device models.

The above embodiments described using a system of equations in time domain or in the frequency domain; however, alternate embodiments may use any combination of time and frequency domain. That is, a combination of the second and third examples may be used in alternate embodiments.

In the foregoing specification, the invention has been described with reference to specific embodiments. However, one of ordinary skill in the art appreciates that various modifications and changes can be made without departing from the scope of the present invention as set forth in the claims below. For example, the methods (or portions of the methods) described herein may be computer implemented methods that can be embodied in software or any computer program product. The software or computer program product may include a plurality of instructions which are executed by a computer (i.e. a processor) coupled to the computer program product. (Note that the software or computer product can also be embedded within the computer or processor as well.) The computer program product can include any computer readable medium (or plurality of computer readable media) including, for example, computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also note that in some embodiments, the term small signal solution may refer to either small signal response or noise response in a circuit (since both may considered small signals, i.e. those that do not substantially perturb the steady-state of the circuit). Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of making an integrated circuit, comprising:
defining a model of a circuit for use on the integrated circuit;
generating circuit equations of the model;
determining a steady state response of the model to large signal excitations;
linearizing about the steady state response to obtain a first order transfer function;
determining a first order response of the model;
determining a second order response of the model using the first order transfer function and the first order response;
determining a third order response of the model using the first order transfer function and the second order response;
analyzing results of the third order response to determine if the circuit is ready to be manufactured; and
manufacturing the integrated circuit.

2. The method of claim 1, wherein the circuit is an analog circuit.

3. The method of claim 1, wherein the circuit equations are formulated in a time domain.

4. The method of claim 1, wherein the circuit equations are formulated in a frequency domain.

5. The method of claim 1, wherein the circuit equations are formulated as being time-invariant.

6. The method of claim 1, further comprising:
modifying the circuit design after the step of analyzing and before the step of manufacturing.

7. A method of analyzing a circuit, comprising:
generating circuit equations of a model of the circuit;
deriving a first order transfer function of the model;
determining a first order response of the model using the first order transfer function; and
determining a second order response of the model using the first order transfer function and the first order response.

8. The method of claim 7, further comprising:
determining a third order response of the model using the first order transfer function and the second order response.

9. The method of claim 8, further comprising determining a steady state response to large signal excitations of the model, and wherein the step of determining a first order response further comprises using the steady state response.

10. The method of claim 9 further comprising identifying shortcomings of the circuit, then modifying the circuit to overcome the shortcomings and manufacturing the circuit as modified.

11. A method of estimating a first solution of a circuit based on first predetermined inputs to the circuit, comprising:
determining a system of equations representing a general solution of the circuit;
determining a second solution of the circuit based on the general solution at second predetermined inputs;
determining a first order transfer function of the general solution at the second predetermined inputs;
solving for a first order estimate of the first solution using the first order transfer function at the second predetermined inputs and the second solution; and
solving for a second order estimate of the first solution using the first order transfer function at the second predetermined inputs and the first order estimate.

12. The method of claim 11, further comprising:
solving for a third order estimate of the first solution using the first order transfer function at the second predetermined inputs and the second order estimate.

13. The method of claim 12, wherein the first solution comprises voltages at nodes within the circuit.

14. The method of claim 11, wherein the equations comprise time domain equations.

15. The method of claim 11, wherein the equations comprise at least one of frequency domain equations and time domain equations.

16. The method of claim 11, wherein the equations comprise time-invariant equations.

17. The method of claim 11 further comprising identifying shortcomings of the circuit, then modifying the circuit to overcome the shortcomings and manufacturing the circuit as modified.

18. The method of claim 17, wherein the first solution comprises voltages at nodes within the circuit, further comprising:
identifying a contribution of each node to a total distortion of the circuit.

19. The method of claim 11, wherein the equations are Kirchoffs laws, and wherein the step of solving for the second order estimate comprises solving a first mathematical formula comprising the first order estimate and a first mathematical expression using the first order transfer function at the second predetermined inputs multiplied by the difference between the first order estimate and the second order estimate.

20. The method of claim 19, further comprising:
solving for a third order estimate of the first solution using the first order transfer function at the second predetermined inputs and the second order estimate.

21. The method of claim 11, wherein the step of solving for the third order estimate comprises solving a second mathematical formula comprising the second order estimate and a second mathematical expression using the first order transfer function at the second predetermined inputs multiplied by the difference between the second order estimate and the third order estimate.

22. A computer-readable medium having stored instructions for directing the operation of a computing device, wherein the stored instructions are for directing the computing device to:
generate circuit equations of a model of the circuit;
derive a first order transfer function or the model;
determine a first order response of the model using the first order transfer function; and
determine a second order response of the model using the first order transfer function and the first order response.

23. The computer-readable medium of claim 22 wherein the stored instructions are for further directing the computing device to:
determine a third order response of the model using the first order transfer function and the second order response.

* * * * *